United States Patent [19]
Kubota et al.

[11] Patent Number: 5,489,367
[45] Date of Patent: Feb. 6, 1996

[54] TARGET FOR REACTIVE SPUTTERING AND FILM-FORMING METHOD USING THE TARGET

[75] Inventors: Kunichika Kubota; Akitoshi Hiraki, both of Yasugi, Japan

[73] Assignee: Hitachi Metals, Ltd., Tokyo, Japan

[21] Appl. No.: 293,133

[22] Filed: Aug. 19, 1994

Related U.S. Application Data

[63] Continuation of Ser. No. 952,654, Sep. 28, 1992, abandoned.

[30] Foreign Application Priority Data

| Sep. 27, 1991 | [JP] | Japan | 3-248932 |
| Mar. 2, 1992 | [JP] | Japan | 4-044653 |
| Jun. 30, 1992 | [JP] | Japan | 4-172092 |

[51] Int. Cl.$^6$ ............................................. C23C 14/34
[52] U.S. Cl. ........................ 204/192.15; 204/192.17; 204/298.13
[58] Field of Search ............... 204/298.13, 192.22, 204/192.15, 192.17; 419/13; 423/411; 501/96

[56] References Cited

U.S. PATENT DOCUMENTS 4,820,393  4/1989  Brat et al. ................ 204/192.15

FOREIGN PATENT DOCUMENTS

| 0291278 | 11/1988 | European Pat. Off. . |
| 2640078 | 6/1990 | France . |
| 63-72866 | 4/1988 | Japan . |
| 63-259075 | 10/1988 | Japan . |

OTHER PUBLICATIONS

Patent Abstracts of Japan vol. 12, No. 301 (C–521)(3148) 16 Aug. 1988 & JP–A–63 72 866 (Nippon Steel Corp) 2 Apr. 1988.

Patent Abstracts of Japan vol. 013, No. 69 (C–569) 16 Feb. 1989 & JP–A–63 259 075 (Nippon Mining Co. Ltd) 26 Oct. 1988.

Journal of Vacuum Science and Technology, B vol. 5, No. 6 Nov. 1987, N.Y. U.S. pp. 1741–1747 XP9919 T. Brat et al 'Characterization of Titanium Nitride Films Sputter Deposited from a High–Purity Nitride Target' p. 1743, left column, line 14–line 22.

Monthly Semiconductor World, pp. 56–60 (Mar. 1992).

*Primary Examiner*—Nam Nguyen
*Attorney, Agent, or Firm*—Sughrue, Mion, Zinn, Macpeak & Seas

[57] ABSTRACT

A target for use in reactive sputtering for forming a film by a reaction with nitrogen, which is a target being composed substantially of titanium and nitrogen and having a nitrogen/titanium atomic ratio, N/Ti, of 0.20 to 0.95, and is used for forming a film whose nitrogen ratio is greater than a ratio of nitrogen to titanium in the target by a reaction with a sputtering gas containing nitrogen, and a method for forming a film, which uses the target.

6 Claims, 11 Drawing Sheets

F I G. 12
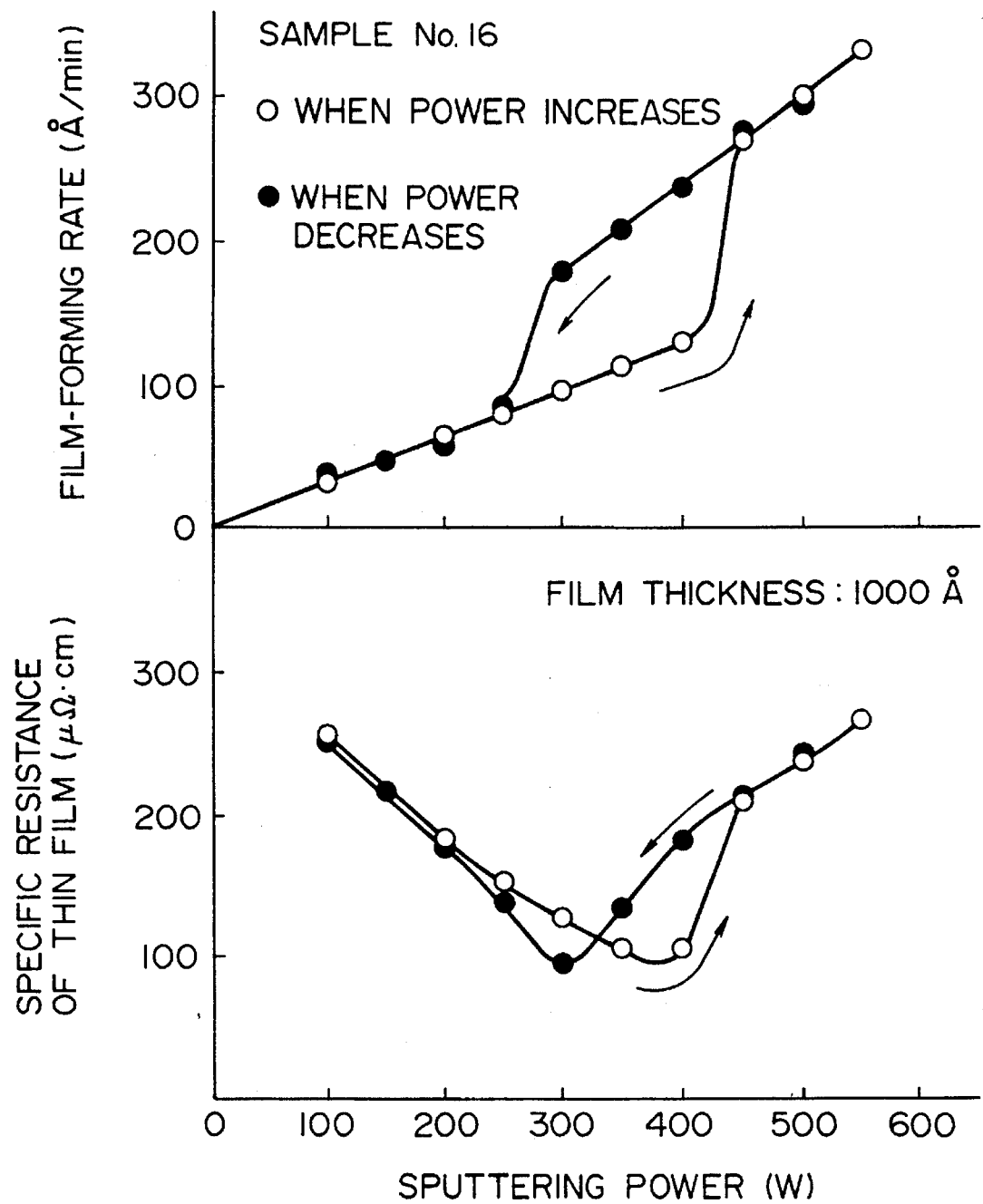

F I G. 13
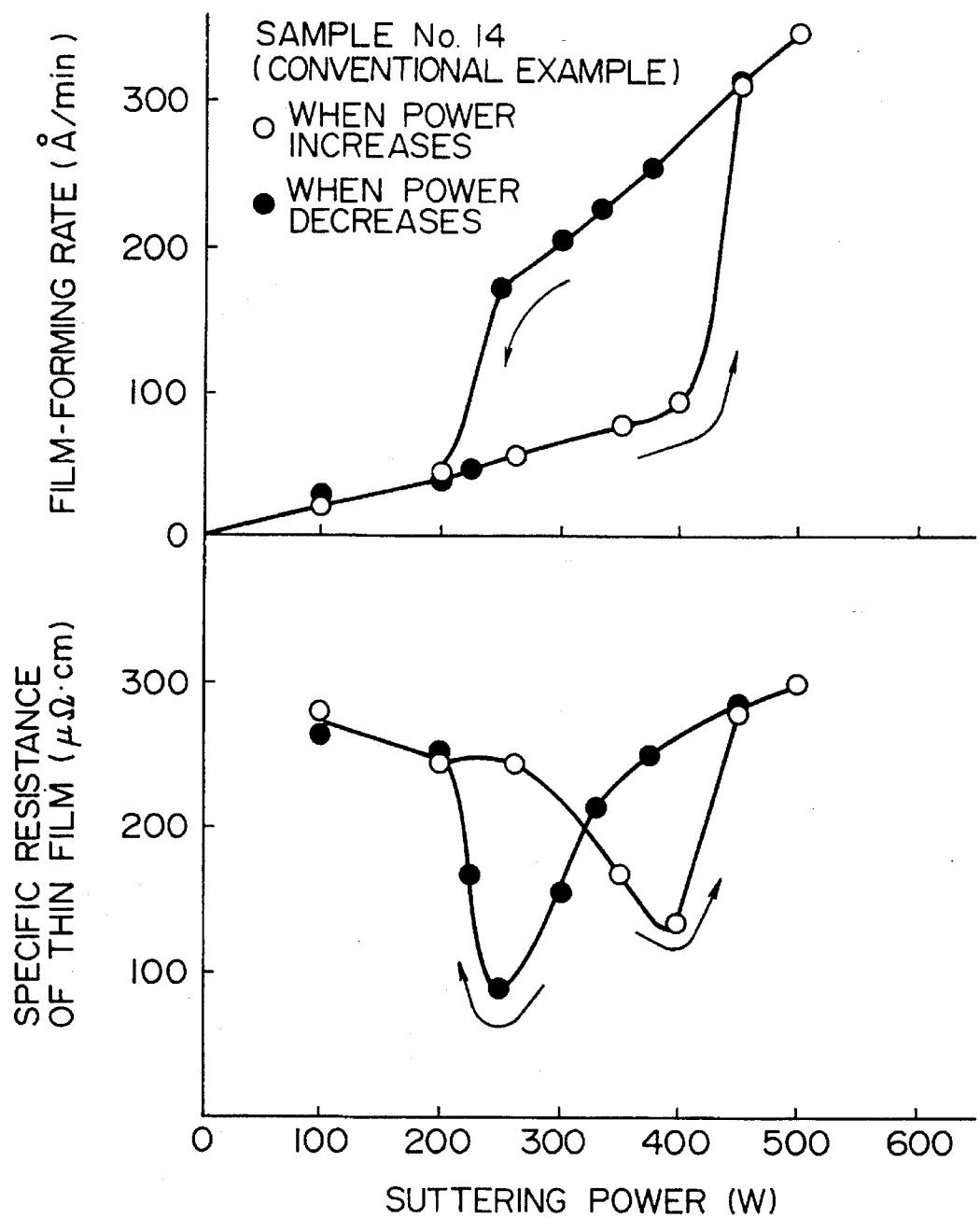

TARGET FOR REACTIVE SPUTTERING AND FILM-FORMING METHOD USING THE TARGET

This is a Continuation of patent application Ser. No. 07/952,654 filed Sep. 28, 1992, abandoned.

FIELD OF THE INVENTION

The present invention relates to a target for use in reactive-sputtering for forming a titanium nitride thin film which is to work as a barrier metal for a semiconductor device, and a method for forming a film from the target.

BACKGROUND OF THE INVENTION

The integration of LSI has been remarkably improved in recent years, and the width of a circuit pattern line is accordingly becoming much finer. LSI has a diffusion-preventing layer formed to prevent the reaction diffusion between aluminum forming electrodes and silicon forming elements. With the circuit pattern line width becoming finer, this diffusion-preventing layer is also required to have a smaller thickness and further required to have a high melting point highly sufficient to prevent the diffusion. Further, since the diffusion-preventing layer constitutes part of an electrode, it is preferred to select a material therefor from materials having lowest possible, specific resistance. A titanium nitride layer is presently attracting attention as a material having a high melting point and low specific resistance and having a remarkably excellent diffusion-preventing effect.

The above titanium nitride layer is formed by a reactive sputtering method using pure titanium as a target (Monthly Semiconductor World, 1992, 3p56). In this reactive sputtering method, an impact is applied to a target of pure titanium by means of charged particles of an nitrogen ion and an argon ion formed by glow discharging, whereby not only the target is nitrided, but also titanium nitride particles are released by the force of the impact to form a titanium nitride film on a silicon wafer opposed to the target.

Further, there is a recently proposed method in which a target of a titanium nitride compound having a nitrogen/titanium atomic ratio of 1:1 is manufactured and the sputtering is carried out with only an argon ion to form a titanium nitride film (U.S. Pat. No. 4,820,393).

However, the above sputtering methods have the following problems. The problem of the former reactive sputtering method using pure titanium as a target is that it is difficult to convert the entirety of titanium to titanium nitride when titanium nitride is formed from nitrogen introduced into a sputtering apparatus and the titanium target. Under some conditions, sputtered particles which are physically driven out by charged particles come to contain unreacted titanium.

When sputtered particles contain unreacted titanium, the resultant thin film contains residual, unreacted titanium, and the unreacted titanium in the thin film and an aluminum thin film formed as a circuit pattern react with each other, which ends up in the deterioration of the intended diffusion prevention, so-called barrier properties.

Since the above unreacted titanium has higher specific resistance than titanium nitride, the unreacted titanium causes an increase in the specific resistance of the thin film.

Furthermore, when pure titanium is used as a target for sputtering, the nitrogen/titanium compositional ratio of the sputtered particles keenly varies relative to the partial pressures of inert gases such as nitrogen and argon introduced to a sputtering apparatus, the pressure of ambient atmosphere and the electric power inputted to the apparatus, and the composition of the resultant titanium nitride thin film also varies. It has been therefore necessary to bring the sputtering conditions under control very accurately for obtaining a low-resistance thin film whose nitrogen/titanium atomic ratio (hereinafter referred to as N/Ti) is substantially 1.

In addition to these problems, the reactive sputtering method using pure titanium as a target involves another problem that the N/Ti differs between a middle portion and a marginal portion of a film on the wafer, i.e., nonuniformity in the film composition.

The above-described problems caused when pure titanium is used as a target are inherent to an attempt to introduce the entirety of nitrogen required to constitute the composition of a thin film in the form of a nitrogen gas.

On the other hand, in the method in which a titanium nitride thin film whose composition agrees with a target composition is formed from a titanium nitride target having an N/Ti atomic ratio, i.e., N/Ti, of 1, there is a problem in that a large number of huge particles, so-called "particles", occur on the resultant titanium nitride thin film to break an electrode pattern line.

The cause for the occurrence of the above particles is considered as follows. When an attempt is made to form a target from a stoichiometric amount of titanium nitride which has N/Ti of substantial 1 and gives low resistance, this titanium nitride so poor in sinterability since its melting point is very high, as high as 3,290° C., that it is difficult to increase the density of a titanium nitride compound target. That is, fine pores are present in the target, and abnormal discharging occurs during the sputtering.

There is another problem in that the target undergoes chipping at a production step or during use due to the fragility of the stoichiometric titanium nitride in the target or low strength in bonding among stoichiometric titanium nitride grains.

The above problems are all due to poor producibility of a target having N/Ti=1 in composition.

Further, there is an attempt to form, by ordinary sputtering, a thin film whose composition agrees with a target composition from a target having a composition of TiNx in which x is 0.1 to 1.0 (Japanese Laid Open Patent No. 63-259075).

However, the above target is ultimately used for forming a film having the same TiNx composition as that of the target, but is not used for forming a film by using a reaction with a nitrogen gas. That is, the above target is used for nonreactive sputtering. For forming a barrier metal layer required to have low resistance, x in TiNx is required to be substantially 1, and after all, the above target has some problems of the stoichiometric titanium nitride target that the sinterability is very poor.

SUMMARY OF THE INVENTION

It is an object of the present invention to provide a target which positively uses a reaction with a nitrogen gas and gives a titanium nitride thin film having a proper composition owing to the reaction with a nitrogen gas.

It is another object of the present invention to provide a target for use in reactive sputtering, which has a characteristic feature in that the degree of variation of a thin film is small even if the reactive sputtering conditions vary, which is almost free from causing particles, and which scarcely undergoes chipping or breaking at a production step, and a method of forming a film from the target.

BRIEF DESCRIPTION OF THE DRAWINGS

FIG. 12 shows film-forming rates and the hysteresis in specific resistance of an obtained film when a target of Sample No. 16 according to the present invention was used for forming the film by changing the sputtering power.

FIG. 13 shows film-forming rates and the hysteresis in specific resistance of an obtained film when a target of Sample No. 14 of Conventional Example was used for forming the film by changing the sputtering power.

Figure 1:
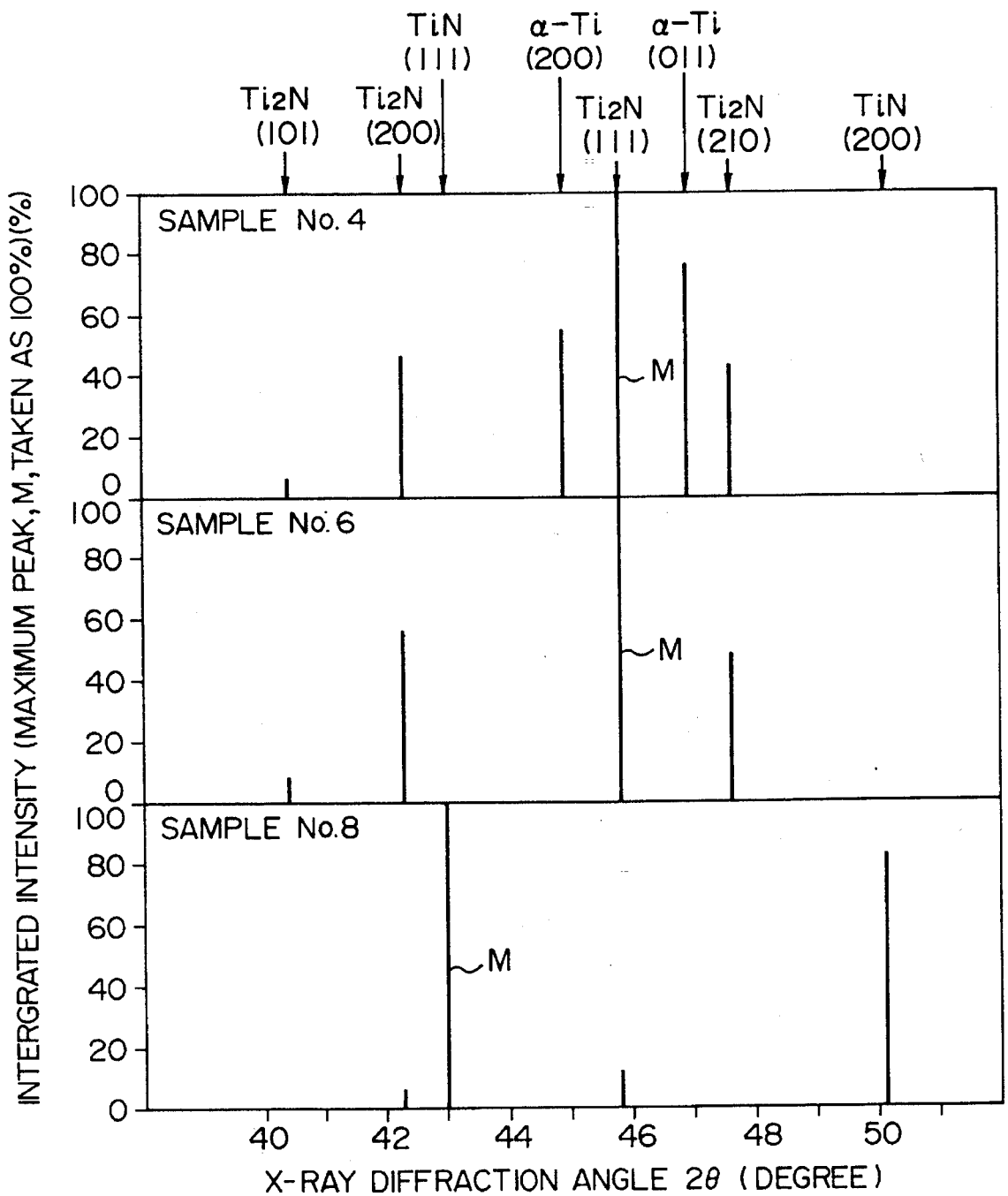
FIG. 1 shows the integrated intensity ratio of crystal phases of samples obtained in Example 1 when the maximum peak in X-ray diffraction was taken as 100%.

The present inventors have made a study on targets for the purpose of forming a titanium nitride film by a reactive sputtering method using a mixed gas of argon and nitrogen, and have found that the above objects are achieved by reactive sputtering for forming a film in which a target has a nitrogen/titanium atomic ratio, N/Ti, of less than 1, nitrogen deficient for forming the film is from the mixed gas, and nitrogen and titanium of the target and nitrogen from the mixed gas are allowed to react. Further, the present inventors have found that a target having a N/Ti atomic ratio, N/Ti, of 0.20 to 0.95 is preferred as a target which hardly forms particles and which is excellent in controlling the film composition in reactive sputtering.

That is, according to the present invention, there is provided a target for use in reactive sputtering for forming a film by allowing the target to react with nitrogen, the target being composed substantially of titanium and nitrogen, having an N/Ti of 0.20 to 0.95, being to be allowed to react with a sputtering gas containing nitrogen, and being to be used for forming a film having a greater nitrogen ratio than the nitrogen ratio in the target.

In the present invention, any gas containing nitrogen can be used as a sputtering gas. Pure nitrogen may be used as well.

DETAILED DESCRIPTION OF THE INVENTION

The present invention will be described further in detail by reference to prior art.

In a conventional reactive sputtering method using a target of pure titanium, pure titanium atoms present on a target surface and a film surface and nitrogen introduced as an atmospheric gas are ionized and allowed to react by a plasma impact. As shown in a treatise on thin solid films by D. K. Hohnke, D. J. Schmatz and M. D. Hurley, 118, 1984, the reaction scheme in the above method is greatly influenced by reactive sputtering conditions, and particularly rate-determined by conditions for introducing reactants. It is therefore greatly depends on the flow amount of gas being introduced into a sputtering apparatus, the composition of the gas, the gas pressure for forming a film and an electric power being inputted to a target (hereinafter referred to as sputtering electric power) which influences the amount of sputtering particles to be released from the target. These factors respectively show dependency having hysteresis with regard to the composition of a thin film.

The sputtering electric power is explained as one example. In reactive sputtering using a target of pure titanium, when a specific power value is reached while increasing the electric power, there is obtained a film having an intended composition. When the electric power goes up for some reason, the result is that the same composition cannot be achieved even if the electric power is reset at the same power value as before by decreasing the electric power.

The hysteresis present in composition-controlling factors has been found to be caused mainly as follows. In the case of using conventional pure titanium target, the sputtering rate of titanium nitride to be formed on the target surface during reactive sputtering and the sputtering rate of pure titanium within the target (abilities to release sputtered particles under the same sputtering conditions) greatly differ, and titanium nitride releases sputtered particles with greater difficulty. For this reason, when the sputtering electric power varies, the nitrided state on the target surface also varies. As a result, in some cases, there is a deviation from the same film composition even if the same sputtering conditions are reset.

Meanwhile, the reactive sputtering target of the present invention has the following excellent features. Due to the use, as a target, of a target containing both nitrogen and titanium, there can be significantly reduced the hysteresis of the composition-controlling factors which is unavoidable in a reactive sputtering using pure titanium, and the variation in the film composition depending upon the sputtering conditions decreases. As a result, a film can be formed with good reproducibility.

Further, it has been found that the use of the reactive sputtering target of the present invention overcomes the above-described nonuniformity of the thin film composition, a problem inherent to the reactive sputtering method using a target of pure titanium. That is, when a target of pure titanium is used, a reaction from titanium to titanium nitride proceeds not only on the target but also on a substrate surface as well as when sputtered particles fly. There is a difference between a distance at which titanium atoms fly to a surface opposed to the central portion of the target and a distance at which titanium atoms fly to a marginal portion of a film being formed on a wafer. For these reasons, nonuniformity occurs in the distribution of the composition. Meanwhile, when a target pre-contains nitrogen like the present invention, nitrogen as well as titanium is released as sputtered particles, and only nitrogen deficient for an intended composition is fed from a nitrogen gas in a gaseous phase. Therefore, the variation in the film composition depending upon a flying distance is greatly reduced as compared with a case using a target of metal titanium requiring the feed of nitrogen from a gaseous phase for the entirety of nitrogen in a film.

In the target of the present invention, the nitrogen/titanium atomic ratio, N/Ti, is limited to 0.95 or less for the following reasons. A target having an N/Ti ratio of more than 0.95 is meaningless for carrying out reactive sputtering. Titanium nitride having a nitrogen/titanium atomic ratio which is nearly a stoichiometric value of N/Ti=1 has no room for adding titanium when the target is produced. It is therefore impossible to expect any effect of titanium on improving the sintering density of the target and increasing the bonding strength among target-constituting grains by imparting the titanium with a metal binder-like function. The nitrogen/titanium atomic ratio, N/Ti, is preferably 0.90 or less.

When the density of the target decreases, abnormal discharging occurs due to fine pores in the target as described above to cause particles on a thin film. The density of the target of the present invention is preferably at least 95% as a relative density.

Further, the nitrogen/titanium atomic ratio is limited to at least 0.20 for the following reason. When a target having a nitrogen/titanium atomic ratio of less than 0.20 is used, the stability of a thin film composition is almost the same as that of a thin film composition produced from a target of pure titanium. There are therefore caused problems similar to those caused when a target of pure titanium is used.

The average crystal grain size of the target of the present invention is preferably not more than 100 μm. When the above average crystal grain size is more than 100 μm, the sputtering rate depending upon crystal orientations is no more negligible, an uneven surface is formed on the target surface, and the degree of occurrence of particles increases.

The reactive sputtering target of the present invention can be obtained by mixing a titanium nitride powder and a titanium powder in such amounts that the specific nitrogen/titanium ratio is achieved, and sintering the resultant mixture.

The reactive sputtering target of the present invention may be also obtained by mixing a titanium nitride powder with hydrogenated titanium, which is excellent in powderability and deoxidation, in place of the titanium powder, subjecting the resultant mixture to dehydrogenation treatment, and then sintering the mixture.

In the present invention, it is preferred to use a pressure sintering method such as a hot isotactic pressing method or a hot pressing method in that the target density is improved.

The crystal phase of the target having a nitrogen/titanium atomic ratio, N/Ti, of 0.20 to 0.95 changes from an αTi type crystal structure (hereinafter referred to as "αTi type") to a $Ti_2N$ type crystal structure (hereinafter referred to as "$Ti_2N$ type") and further from the $Ti_2N$ type to a TiN type having NaCl type crystal structure (hereinafter referred to as "NaCl type") with a change of the N/Ti from 0.20 to 0.95. Under some conditions, a δ' phase may be found in between a $Ti_2N$ type and an NaCl type. In any boundary between the two of these crystal phases, a composite crystal phase is found. The crystal phase differs depending upon heating and cooling conditions during the process of producing the target. Out of targets having these crystal phases, the features of the target of the present invention will be explained below concerning a target having an NaCl type crystal phase and a target having a $Ti_2N$ type crystal phase as targets having effective crystal phases.

1. Target for use in reactive sputtering, which substantially comprises an NaCl type crystal phase.

This target has excellent features in that the hysteresis of each composition-controlling factor which is unavoidable in a reactive sputtering method using a target of pure titanium can be nearly overcome, that the variation of the film composition depending upon sputtering conditions can be greatly decreased, and that films can be produced with good reproducibility.

This is because of the following: Since the crystal structure of the target composition is formed of a substantially NaCl type single phase, both the interior of the target and the target surface to be nitrided with a sputtering gas have identical phases such as NaCl type titanium nitride during reactive sputtering. Therefore, there can be removed the difference in the sputtering rate between the interior of the target and the target surface, which difference is a main cause of hysteresis.

Further, the present inventors have found that the use of a sputtering target formed substantially of an NaCl type crystal phase can remarkably overcome the nonuniformity of a thin film composition inherent to a reactive sputtering method using a target of pure titanium. When a target of pure titanium is used, not only a reaction from titanium to titanium nitride proceeds on the target surface, but also the same reaction proceeds when sputtered particles fly and on a substrate surface, which results in nonuniformity in the distribution of the composition. When, however, a target has an NaCl type titanium nitride phase, sputtered particles do not require a reaction between nitrogen and titanium unlike sputtered particles from a target of pure titanium, or sputtered particles require it to a slight degree if they require any. It is therefore considered that a variation in the distance of flight of sputtered particles from the target to the substrate has almost no influence on the film composition.

For obtaining a thin film having low resistance necessary as a barrier metal layer for a semiconductor, it is required to adjust the nitrogen/titanium ratio to a very narrow range of 1/1. The stability of the film composition is therefore very important. In the target of the present invention. there can be stably obtained a composition having a nitrogen/titanium ratio of nearly 1/1.

For obtaining a target whose crystal structure is substantially of an NaCl type in the present invention, the nitrogen/titanium atomic ratio, N/Ti, is required to be at least 0.40.

For obtaining a target having an NaCl type crystal phase:
(1) it is required to prepare raw materials such that the specific nitrogen/titanium atomic ratio is achieved to obtain an NaCl type crystal structure.
(2) it is required to add a titanium powder so as to obtain a target having a high density.
(3) it is required to convert a titanium nitride/titanium mixed powder to an NaCl type by sintering treatment under heat, and cool the resultant, sintered body while it retains an NaCl type crystal structure.

That is, the above reactive sputtering target can be produced by mixing a titanium nitride powder and a titanium powder such that the nitrogen/titanium atomic ratio, N/Ti, is 0.40 to 0.95, sintering the resultant mixture under heat to convert its crystal phase to a single crystal phase of a substantial NaCl type, and then cooling the resultant sintered body to obtain a target having a single crystal phase of a substantial NaCl type.

Further, the above titanium powder may be replaced with a hydrogenated titanium powder. Since a hydrogenated titanium powder is remarkably excellent over a titanium powder, a very fine and homogeneous mixed powder can be obtained by powdering and mixing a titanium nitride powder and a hydrogenated titanium powder with a ball mill or attriter. When the mixed powder is prepared as a fine and homogeneous one, titanium which functions as a metal binder promotes sintering and contributes toward achieving a high density since it is finely and homogeneously dispersed. Further, since the mutual diffusion distance between nitrided titanium which is to be a raw material and titanium decreases, an NaCl type single phase can be easily formed. When a hydrogenated titanium powder is used, the mixed and powdered mixture of a nitrided titanium powder and a hydrogenated titanium powder is required to be subjected to dehydrogenation treatment. The dehydrogenation treatment may be carried out during the sintering treatment under heat.

When the titanium powder as a raw material or the hydrogenated titanium powder has a large size, a small amount of unreacted titanium sometimes remain. It is therefore effective to carry out the solution treatment of the above-obtained sintered body in an inert atmosphere. By this treatment, the crystal phase of the sintered body can be converted to an NaCl type titanium nitride single phase.

In the present invention, the temperature for the solution treatment is preferably between 1,100° C. and 1,800° C.

If the above temperature is lower than 1,100° C., no effect is obtained since no diffusion occurs. When it exceeds 1,800° C., undesirably, crystal grains grow extraordinarily, and the average crystal grain size becomes 100 μm or more.

Preliminary shaping by a cold isotactic pressing method before the sintering treatment under heat is effective for achieving a high density and a single phase. That is, the mechanically nitrided titanium powder and the titanium powder are brought into contact with each other under pressure by the preliminary shaping, and the nitrided titanium and titanium are mutually vigorously diffused when a mixture thereof is sintered.

For promoting the mutual diffusion between the nitrided titanium and titanium and obtaining a high-density sintered body, it is preferred to use a pressure sintering method such as a hot isotactic pressing method or a hot pressing method.

2. Target having a $Ti_2N$ type crystal phase as a main phase

A target having, as a main phase, a $Ti_2N$ type phase which appears when the N/Ti ratio is in the composition range of 0.35 to 0.55 particularly shows a decreased fragility and improved machinability, and can be produced easily. Further, when such a target is used, occurrence of particles on the thin film can be prevented since it has an improved sintered density. A phase to be of a $Ti_2N$ type can be easily identified as a simple tetragonal crystal by X-ray diffraction.

Although being a compound, this phase of a $Ti_2N$ type shows better processability than a phase of an NaCl type. The reason therefor is considered as follows. In a phase of an NaCl type, bonding of (100) planes which are cleavage planes is mainly nonmetallic (ionic or covalent) bonding. Since, however, bonding of the equivalent (001) planes in a phase of a $Ti_2N$ type is characteristically metal bonding among titanium atoms, the fragility decreases. Therefore, chipping, etc., during the production can be prevented.

A target having a phase of a $Ti_2N$ type as a main phase shows a sharp decrease in hardness as compared with a target having a phase of an NaCl type as a main phase, and the hardness of the target having a phase of a $Ti_2N$ type as a main phase can be decreased to a Vickers hardness of about 1,500 or less at which the degree of chipping from the target is very small when the target is surface-grounded.

Further, having a lower melting point than a phase of NaCl type, this phase of $Ti_2N$ type shows an improvement in sinterability. Therefore, gas pores can be prevented from remaining in the sintered body, and there can be obtained a film having a decreased number of particles.

The nitrogen/titanium atomic ratio, N/Ti, of the $Ti_2N$ target of the present invention is limited to not more than 0.55 for a reason that, when the nitrogen/titanium atomic ratio is more than 0.55, the target has an NaCl type phase as a main phase.

Further, the nitrogen/titanium atomic ratio, N/Ti, of the $Ti_2N$ target of the present invention is limited to at least 0.35 for reasons that the target is liable to have an α—Ti phase as a main phase, and that the hysteresis in an inputted electric power—film-forming rate curve becomes greater, which hysteresis deteriorates the above controllability on film formation.

The hysteresis of the $Ti_2N$ target is remarkably smaller than that of a reactive sputtering target of pure titanium. However, this hysteresis is a little greater than that of a target having an NaCl type phase as a main phase.

The $Ti_2N$ target may contain an α-Ti phase, an NaCl type phase and a δ' phase in addition to the $Ti_2N$ type phase as a main phase. The amount of each of the α-Ti phase, the NaCl type phase and the δ' phase in the target depends on the nitrogen/titanium atomic ratio of the target and the temperature and cooling rate at a sintering time.

A composition which becomes a $Ti_2N$ type forms an NaCl type when it is in a high temperature range over about 1,100° C. For obtaining a target having a $Ti_2$ N type phase as a main phase at room temperature, it is required to cool the composition gradually. Specifically, it is preferred to cool the composition to 600° C. at a rate of 500° C./hour, preferably 300° C./hour.

EXAMPLES

Example 1

The production of targets and characteristics of the targets will be described first, and then the reactive sputtering properties will be described.

1-1 Production and characteristics of targets

A titanium nitride powder having a nitrogen/titanium atomic ratio, N/Ti, of 1, containing 22.6% by weight of nitrogen and a remaining portion of titanium and having a purity of at least 99.99% and an average particle diameter of 40 μm and a pure titanium powder having a purity of at least 99.99% and an average particle diameter of 40 μm were mixed in predetermined mixing ratios, and the resultant mixtures were respectively blended with a V-blender. The resultant mixed powders were respectively charged into capsules having an internal diameter of 400 mm for use in hot isotactic pressing, and subjected to hot isotactic pressing at 1,250° C. for 5 hours at 100 MPa. Then, the resultant pressed mixtures were cooled to 600° C. at a rate of 1 300° C./hour, and then allowed to cool to room temperature to give sintered bodies having a diameter of 380 mm and a thickness of 10 mm and having a nitrogen/titanium atomic ratio of 0 to 1.

Table 1 shows the N/Ti's, relative densities and crystal phase volume percentages of the so-obtained targets. All of the sintered bodies having an N/Ti of 0.60 or smaller have a relative density of more than 99%, and it can be seen that targets having a high density can be obtained when the N/Ti is decreased. In addition, Samples Nos. 1 to 13 in Table 1 correspond to equivalent Samples Nos. 1 to 13 in FIGS. 1 to 6.

to be at random, the theoretical intensity ratio described in the above "Elements of X-Ray Diffraction" was calculated, and actual intensity ratios were corrected.

The above-prepared sintered bodies were respectively cut into a size of 300 mm in diameter×10 mm in thickness by electrical discharge machining, and surface-ground from the thickness of 10 mm to 6 mm to obtain targets having a predetermined dimension. Table 2 shows a state of chipping occurrence when each sintered body was surface-ground at several depths with diamond #120 as a grinder at a grinder

TABLE 1

| Sample No. | N/Ti atomic ratio | Relative density (%) | Crystal phase (vol. %) | | | Average crystal grain size (μm) | Remarks |
|---|---|---|---|---|---|---|---|
| | | | αTi type | Ti$_2$N type | NaCl type | | |
| 1 | 0.00 | 100.0 | 100 | 0 | 0 | 225 | Conventional Example |
| 2 | 0.11 | 100.0 | 100 | 0 | 0 | 184 | Comparative Example |
| 3 | 0.20 | 100.0 | 100 | 0 | 0 | 153 | The invention |
| 4 | 0.35 | 100.0 | 32 | 68 | 0 | 95 | |
| 5 | 0.40 | 100.0 | 0 | 100 | 0 | 43 | |
| 6 | 0.44 | 100.0 | 0 | 100 | 0 | 35 | |
| 7 | 0.51 | 99.9 | 0 | 100 | 0 | 29 | |
| 8 | 0.55 | 99.8 | 0 | 51 | 49 | 26 | |
| 9 | 0.60 | 99.5 | 0 | 0 | 100 | 24 | |
| 10 | 0.72 | 98.6 | 0 | 0 | 100 | 22 | |
| 11 | 0.89 | 97.0 | 0 | 0 | 100 | 22 | |
| 12 | 0.95 | 92.3 | 0 | 0 | 100 | 21 | |
| 13 | 1.00 | 87.9 | 0 | 0 | 100 | 20 | Conventional Example |

Concerning a phase ratio, in the region where the nitrogen/titanium atomic ratio is 0.35 to 0.55, a Ti$_2$N type phase makes up at least 50% and forms a main phase.

Figure 2:
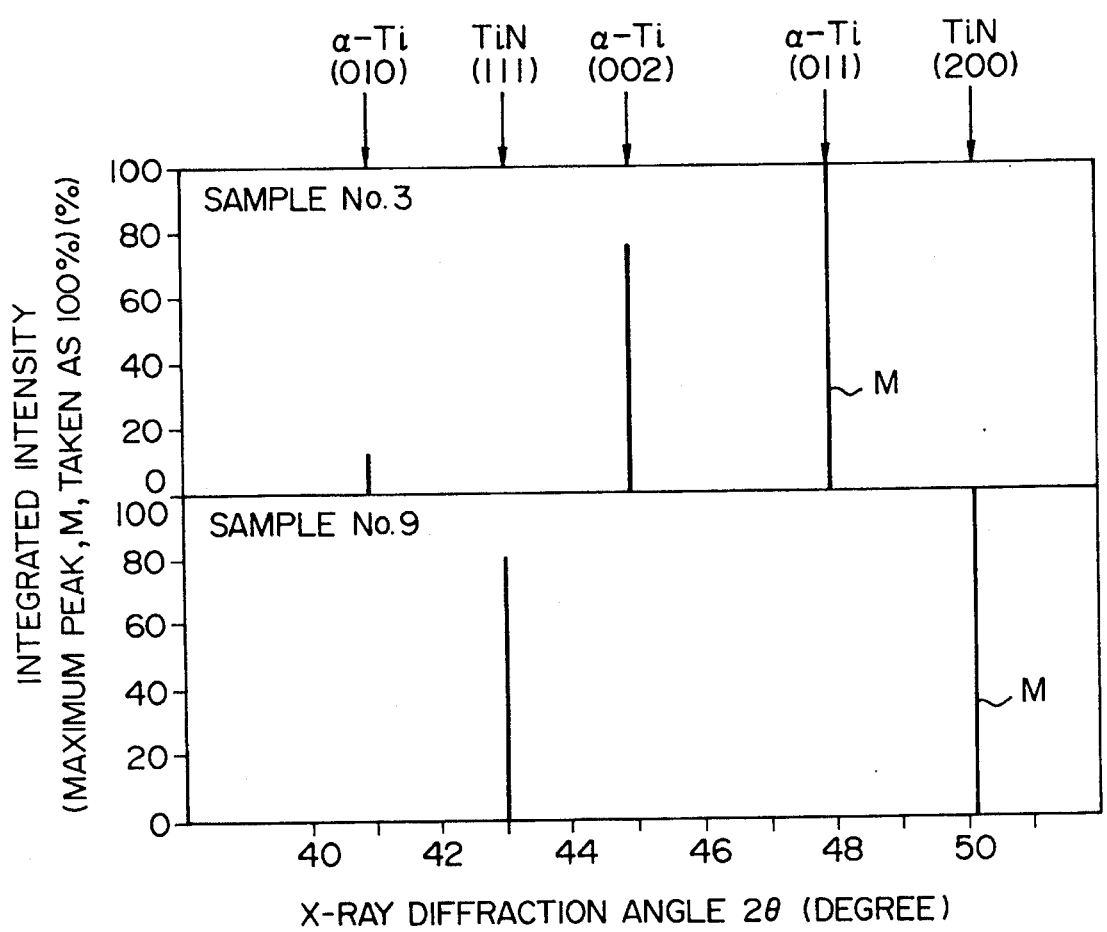
FIG. 2 shows the integrated intensity ratio of crystal phases of samples obtained in Example 1 when the maximum peak in X-ray diffraction was taken as 100%.

The phase ratio was calculated on the basis of relative peak intensities obtained by X-ray diffraction. FIGS. 1 and 2 show data which were the base for calculation of the phase ratio. Diffraction peak intensities in the range of 2θ=38° to 53° were measured with a light source Co-Kα, at 40 KV and at 60 mA, and expressed as integrated intensities when the maximum peak was taken as 100%. These data were assigned to indices of crystal planes by the method described in "Elements of X-Ray Diffraction", second edition, by B. D. Cullity by reference to X-ray crystal identifying cards of ASTM (American Society for Testing and Materials), No. 5-0682 (α-Ti), 6-0642 (TiN), 17-386 (Ti$_2$N) and 23-1455 (δ'). This "TiN" means NaCl type crystal structure.

FIGS. 1 and 2 show crystal phases of sintered bodies which were to be used as targets in Examples of the present invention. In FIG. 1, it can be concluded that Sample No. 4 had two phases of α-Ti and Ti$_2$N, that Sample No. 6 had a single phase of Ti$_2$N and that Sample No. 8 had two phases of Ti$_2$N and TiN. In FIG. 2, Sample No. 3 had an α-Ti single phase, and Sample No. 9 had a TiN single phase. The phase ratio in each of Samples Nos. 4 and 6 were calculated by the following equations and are shown in Table 1.

$$X_{TiN/Ti2N} = (I_{TiN(111)} + I_{TiN(200)})/(2 \times 7.95 \times I_{Ti2N(111)}) \quad (1)$$

$$X_{\alpha-Ti/Ti2N} = (I_{\alpha-Ti(002)} + I_{\alpha-Ti(011)})/(2 \times 1.34 \times I_{Ti2N(111)}) \quad (2)$$

$X_{TiN/Ti2N}$ is the phase ratio of a mixed phase of TiN and Ti$_2$N, $I_{TiN(200)}$ and $I_{TiN(111)}$ are the peak intensities of (111) and (200) of a TiN phase, $I_{Ti2N(111)}$ is the peak intensity of (111) of a Ti$_2$N phase, and $I_{\alpha-Ti(002)}$ and $I_{\alpha-Ti(011)}$ are peak intensities of (002) and (011) of an α-Ti phase. In the above equations (1) and (2), the crystal orientations were supposed rotation rate of 1,200 rpm at a feed rate of 12 m/min and a Vickers hardness of each sintered body. The term "chipping" refers mainly to surface peeling at least 0.1 mm deep which occurred from a gound surface end portion, and tends to spread over a ground surface as the grinding proceeds. In Table 2, the chipping is evaluated as a proportion of a grinding-induced chipping area to the entire area of a grounded surface.

In all of Samples Nos. 9 to 13 having an NaCl type single phase but Sample No. 13, occurrence of chipping was observed when the Samples were grounded at a depth of at least 5 μm, and these had a hardness of at least HV 1,500. It was because of residual gas pores that Sample No. 13 had a low hardness and showed excellent processability. Sample No. 13 was therefore not suitable as a target material.

It is seen that Samples Nos. 1 to 3 having an α-Ti single phase and Samples Nos. 4 to 8 having a Ti$_2$N phase a main phase are excellent in processability, since their crystals exhibit the characteristics of a metal as described above and they have a hardness of not more than HV 1,500.

TABLE 2

| Sample No. | Depth (μm) | | | | Hardness (Hv) | Remarks |
|---|---|---|---|---|---|---|
| | 2 | 5 | 10 | 20 | | |
| 1 | O | O | O | O | 201 | Conventional Example |
| 2 | O | O | O | O | 356 | Comparative Example |
| 3 | O | O | O | O | 421 | The invention |
| 4 | O | O | O | O | 663 | |
| 5 | O | O | O | O | 847 | |
| 6 | O | O | O | O | 1130 | |
| 7 | O | O | O | O | 1210 | |
| 8 | O | O | O | O | 1320 | |

TABLE 2-continued

| Sample | Depth (μm) | | | | Hardness | |
|---|---|---|---|---|---|---|
| No. | 2 | 5 | 10 | 20 | (Hv) | Remarks |
| 9 | ○ | Δ | Δ | X | 1672 | |
| 10 | ○ | Δ | Δ | X | 1810 | |
| 11 | ○ | Δ | X | X | 1930 | |
| 12 | ○ | Δ | X | X | 1530 | |
| 13 | ○ | ○ | ○ | ○ | 510 | Conventional Example |

X ... Chipping area: 10% or more
Δ ... Chipping area: 10% or less
○ ... Chipping area: not recognized 1-2 Reactive Sputtering Properties Out of the produced target materials, Samples Nos. 1 to 12 having a density of at least 90% were respectively set at a sputtering apparatus, and the conditions to form a thin film having a nitrogen/titanium atomic ratio of 1 at a sputtering power of 7 KW were determined as shown in Table 3. Specifically, the conditions were determined by the following procedures.

In reactive sputtering, the thin film composition is determined by a reaction ratio of target unreacted atoms, and represented by $$(N/Ti)_F = C_{(N/Ti)} \times 1 + \{(1 - C_{(N/Ti)})\} \times X \quad (1)$$

$(N/Ti)_F$ is the atomic ratio of nitrogen to titanium in a film, $C_{(N/Ti)}$ is the atomic ratio of nitrogen to titanium in a target, and X is the reaction ratio by film formation from unreacted titanium when other than titanium nitride having a stoichiometric amount of N/Ti=1 is supposed to be unreacted titanium. This reaction ratio is determined by a feed balance between a reaction gas and unreacted titanium atoms, and therefore represented as $$X = K \times Q \times C_{(N2)} / \{1 - C_{(N/Ti)}\} \times V \quad (2)$$

in which K is an apparatus constant, Q is the amount of a feed gas, $C_{(N2)}$ is the volume percentages of $N_2$ gas in the feed gas ($Ar+N_2$), and V is a film-forming rate. The intended film composition is $(N/Ti)_F = 1$, and therefore, X=1 according to the equation (1). This is substituted in the equation (2) to give an equation (3).

$$K = \{1 - C_{(N/Ti)}\} V / Q \times C_{(N2)} \quad (3)$$

The right-hand side of the equation (3) shows a measurable amount, and therefore, the apparatus constant, K, can be determined. The apparatus constant used in this Example was K=3.65 Å/Pa·m³. On the basis of the equation (3) wherein the film-forming rate V was 90 Å/min, a gas composition was determined which satisfied the conditions of the gas pressure and gas flow rate required for the apparatus. Film-forming rate which was practically attained was shown in Table 4. Other sputtering conditions were also shown in Table 4.

Figure 3:
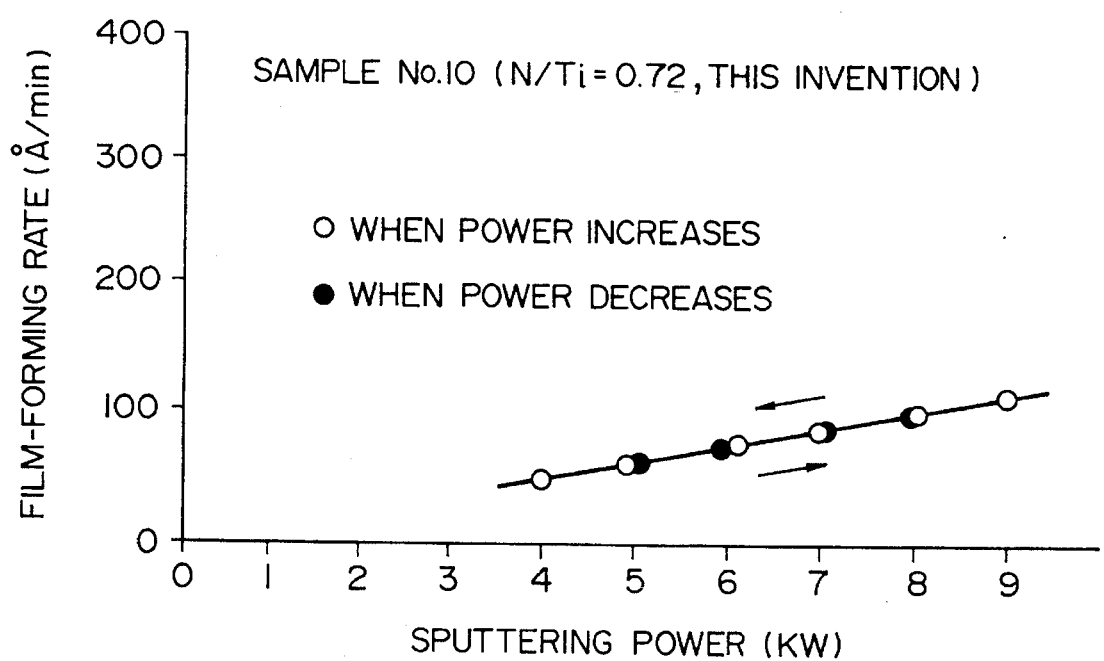
FIG. 3 shows a change in the film-forming rate with regard to a sputtering power when a target of Sample No. 10 according to the present invention was used.
Figure 4:
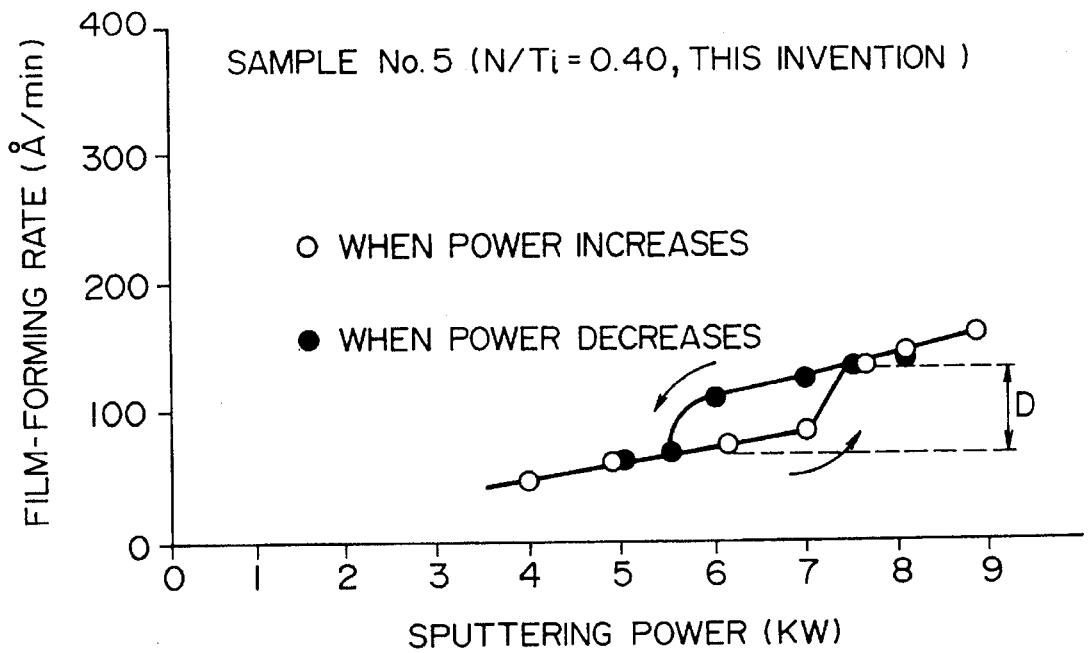
FIG. 4 shows the hysteresis in the film-forming rate when a target of Sample No. 5 according to the present invention was measured for film-forming rates by changing the sputtering power.
Figure 5:
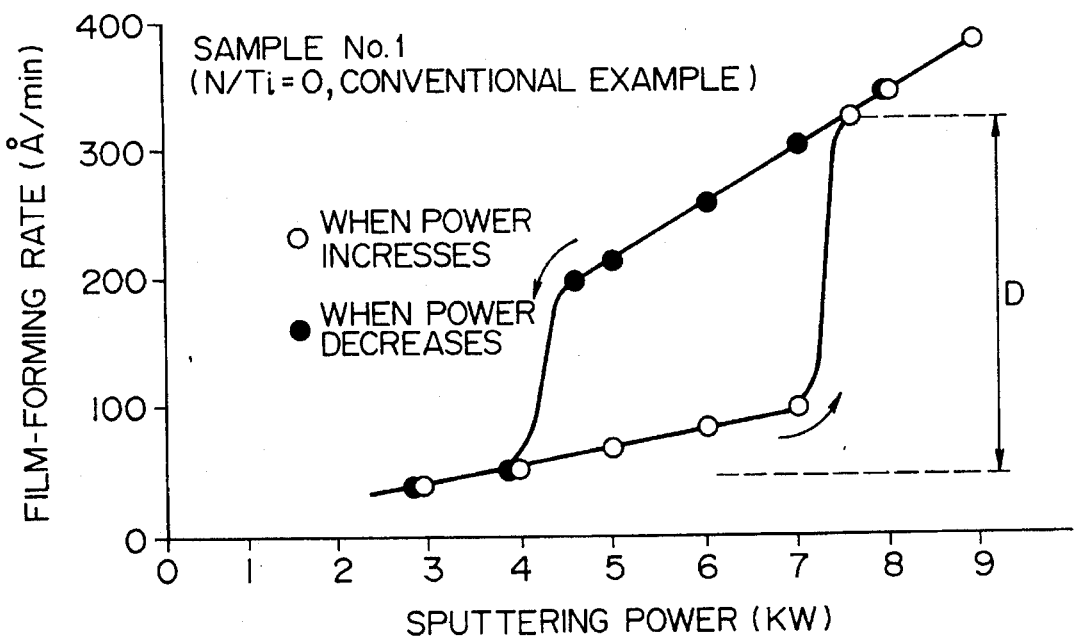
FIG. 5 shows the hysteresis in the film-forming rate when a target of Sample No. 1 of Conventional Example was measured for film-forming rates by changing the sputtering power.

FIGS. 3, 4 and 5 show changes in film-forming rates measured with a target of an NaCl type (Sample No. 10) of the invention, a target of a $Ti_2N$ type (Sample No. 5) and a target of an α-Ti phase of Conventional Example relative to sputtering powers. The targets other than the target of an NaCl type (Sample No. 10) in these three figures showed a so-called hysteresis phenomenon, in which the power-film-forming rate function when the power increase and that when the power decrease did not follow the same course. In contrast, when Sample No. 5 of the present invention was used, the width of hysteresis which deteriorates controllability of the film forming was much narrower than that in Comparative Example.

Figure 6:
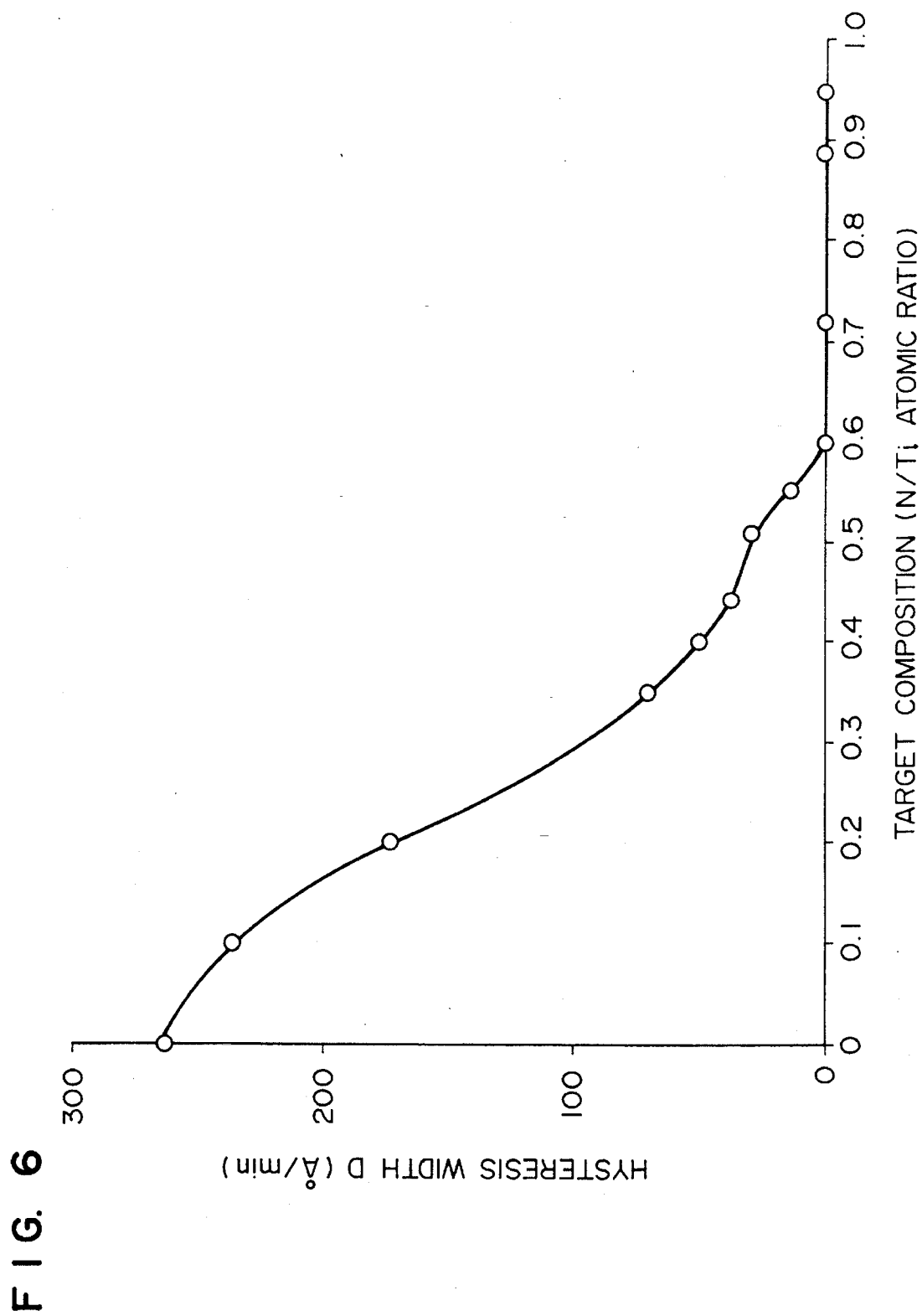
FIG. 6 shows the relationship between a target composition and the hysteresis width, D, in the film-forming rate.

On the assumption that the range of the film-forming rate which differs between a power increase and a power decrease as shown in FIGS. 4 and 5 was a hysteresis range D, targets of Samples Nos. 1 to 12 were measured for ranges D. FIG. 6 shows the results. As shown in FIG. 6, with an increase in the nitrogen amount, the hysteresis width becomes narrower. In particular, in Samples Nos. 3 and 4 whose main phase is of a $Ti_2N$ type, the hysteresis width becomes sharply narrower, and the targets having a $Ti_2N$ type phase according to the present invention come to have excellent film-forming controllability. Further, the hysteresis disappears in the targets having an NaCl type phase.

That is, FIG. 6 shows the following. In reactive sputtering, a target of an NaCl type is the most superior in film-forming controllability, and a target of a $Ti_2N$ type is next to it.

Figure 7:
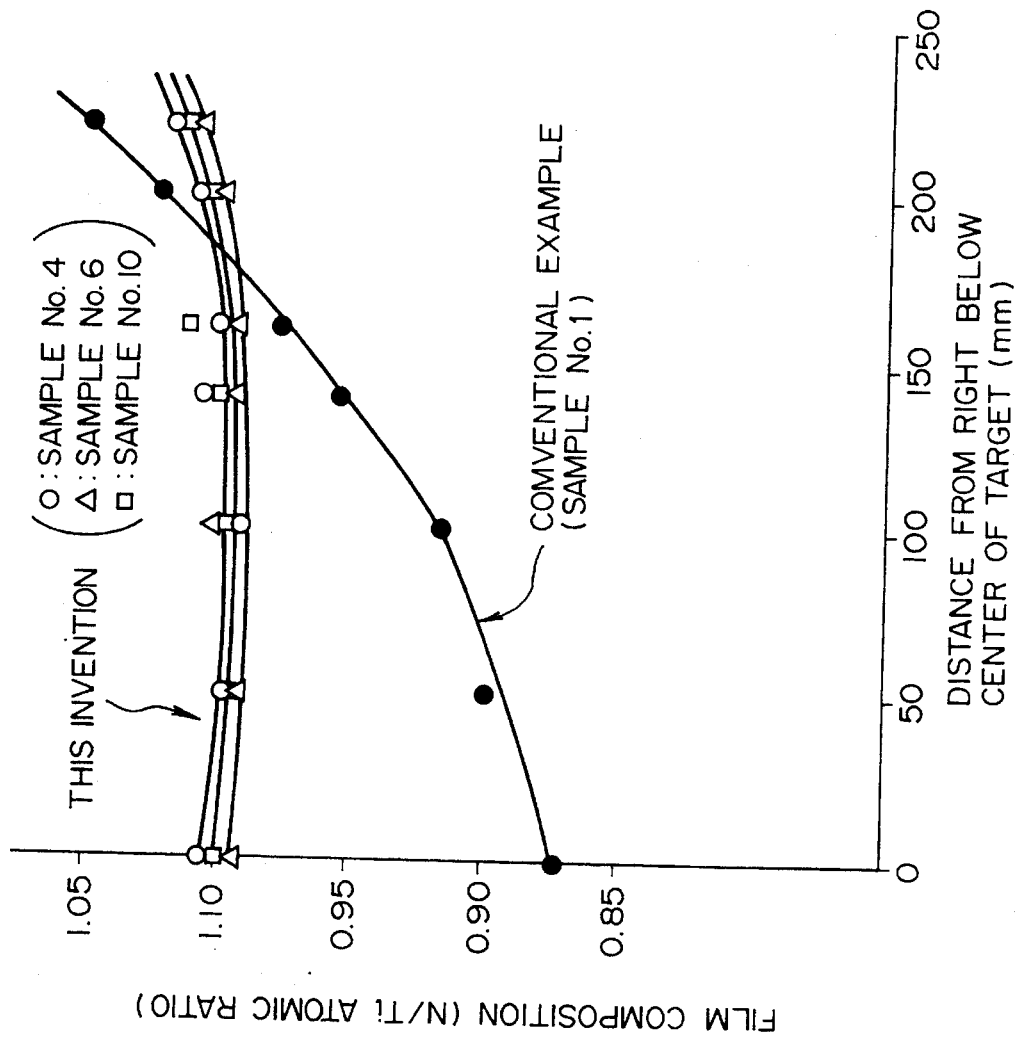
FIG. 7 shows the uniformity in the composition of each film obtained when targets of the present invention and a target of Conventional Example were used.

While Sample No. 1 of Conventional Example and Samples Nos. 4, 6 and 10 according to the present invention were used as targets for forming thin films at an EPMA accelerating voltage of 15 KV, the thin films were measured for composition distributions with the point right below the center of each target as a starting point. FIG. 7 shows the results. As shown in FIG. 7, when Sample No. 1 of an α-Ti single phase was used, the nitrogen content increased with an increase in the distance from the point right below the center of the target, or it was difficult to obtain a uniform thin film composition.

On the other hand, Sample No. 10 of an NaCl type single phase and Samples Nos. 4 and 6 of a $Ti_2N$ phase as a main phase all according to the present invention gave uniform thin film compositions.

TABLE 3

| Sample No. | $N_2$ content in feed gas (%) | Flow rate of feed gas (Pa · m³/s) | Film-forming rate (Å/min) |
|---|---|---|---|
| 1 | 50 | 0.915 | 100.2 |
| 2 | 50 | 0.807 | 99.3 |
| 3 | 50 | 0.712 | 97.5 |
| 4 | 50 | 0.566 | 95.3 |
| 5 | 50 | 0.494 | 90.2 |
| 6 | 50 | 0.460 | 90.0 |
| 7 | 50 | 0.401 | 89.5 |
| 8 | 50 | 0.362 | 88.1 |
| 9 | 30 | 0.561 | 92.1 |
| 10 | 30 | 0.390 | 91.4 |
| 11 | 10 | 0.468 | 93.1 |
| 12 | 10 | 0.204 | 89.5 |

TABLE 4

| Item | Film-forming conditions |
|---|---|
| Substrate temperature | 300° C. |
| Base pressure | $<3.0 \times 10^{-4}$ Pa |
| Working gas pressure | 0.6 Pa |
| Presputtering time | 5 minutes |

Example 2

The production of targets and characteristics of the targets will be described first, and then the reactive sputtering properties will be described.

2-1 Production and characteristics of targets

A titanium nitride powder having a nitrogen/titanium atomic ratio, N/Ti, of 1, containing 22.6% by weight of nitrogen and a remaining portion of titanium and having a purity of at least 99.99% and an average particle diameter of 40 μm and a hydrogenated titanium powder having a purity of at least 99.99% and an average particle diameter of 40 μm were mixed in an N/Ti mixing ratio of 0 to 1.0, and the resultant mixtures were respectively blended with a ball mill. In the mixing ratio, the N/Ti of 0 refers to a case where a hydrogenated titanium power alone was used as a raw material, and the N/Ti of 1 refers to a case where a titanium nitride powder alone was used as a raw material. The resultant mixed powders were respectively charged into capsules having an internal diameter of 133 mm for use in hot isotactic pressing, and subjected to hot isotactic pressing at 1,250° C. for 5 hours at 100 MPa. Then, the resultant pressed mixtures were cooled at a rate of 500° C./hour to give sintered bodies having a diameter of 75 mm and a thickness of 6 mm and having a N/Ti of 0 to 1. In addition, the sintered bodies were processed at a depth of 2 μm at which no chipping occurred when the sintered bodies were surface-ground as in Example 1.

Figure 8:
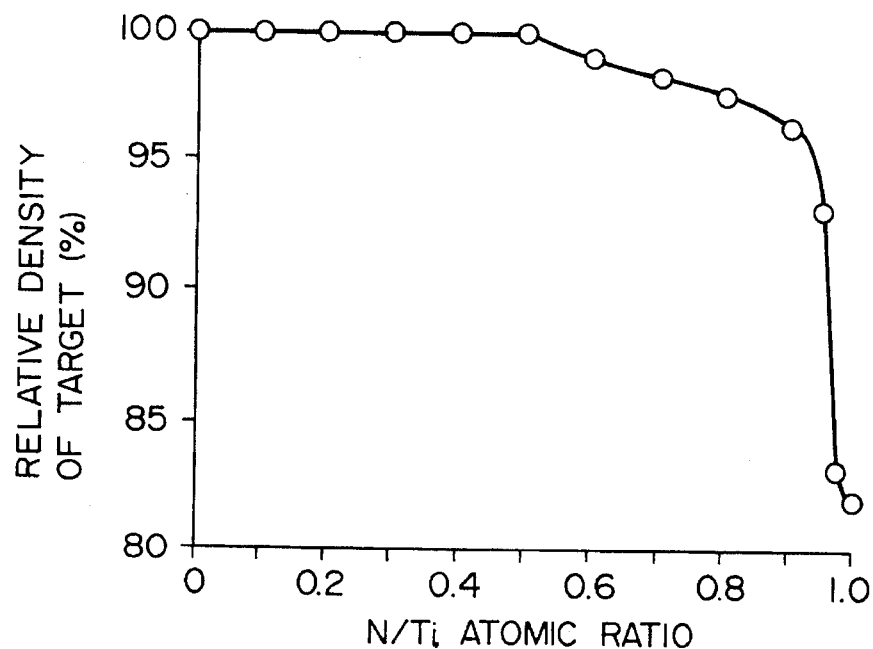
FIG. 8 shows the relationship between a target composition and the relative density of an obtained target in Example 2.

FIG. 8 shows the relationship between the N/Ti of the obtained targets and the relative density thereof.

FIG. 8 shows that when the nitrogen/titanium atomic ratio exceeds 0.95, undesirably, the density sharply declines. The crystal phase of each of the above-obtained targets was determined by X-ray diffraction. Further, the targets were measured for their average crystal grain sizes by etching them. Table 5 shows the results. In Example 1, the range of the N/Ti atomic ratio where NaCl type single phase effective for removing the hysteresis was formed was 0.6 to 1.0, while the range of the N/Ti atomic ratio in this Example was widened to 0.4 to 1.0. This is because the average particle diameter of the powder before HIP was finer, and higher uniformity in the composition was achieved, due to the use of well-powderable hydrogenated titanium and the ball mill for mixing and powdering.

Other factor which contributed toward the above achievement was that smaller HIP capsules were used to increase the cooling rate, and it is seen that the range of the N/Ti atomic ratio for forming an NaCl type Composition effective for film-forming controllability is widened by controlling the cooling conditions.

The targets obtained in Example 2 were used to form films having a thickness of 1,000 Å on wafers having a diameter of 6 inches in the presence of a sputtering gas containing a mixed gas of argon and nitrogen.

TABLE 5

| Sample No. | N/Ti atomic ratio | Crystal phase (%) | | | Average crystal grain size (μm) | Remarks |
| --- | --- | --- | --- | --- | --- | --- |
| | | αTi | Ti$_2$N | TiN (NaCl type) | | |
| 14 | 0 | 100 | 0 | 0 | 511 | Conventional Example |
| 15 | 0.11 | 100 | 0 | 0 | 443 | Comparative Example |
| 16 | 0.20 | 82 | 18 | 0 | 220 | The |
| 17 | 0.31 | 29 | 71 | 0 | 194 | invention |
| 18 | 0.40 | 0 | 0 | 100 | 120 | |
| 19 | 0.51 | 0 | 0 | 100 | 85 | |
| 20 | 0.62 | 0 | 0 | 100 | 69 | |
| 21 | 0.72 | 0 | 0 | 100 | 41 | |
| 22 | 0.81 | 0 | 0 | 100 | 40 | |
| 23 | 0.90 | 0 | 0 | 100 | 37 | |
| 24 | 0.95 | 0 | 0 | 100 | 35 | |
| 25 | 0.97 | 0 | 0 | 100 | 32 | Comparative |
| 26 | 1.00 | 0 | 0 | 100 | 30 | Example |

The film-forming conditions were set in the same manner as in Example 1. In this case, the sputtering power was 400 W and the apparatus constant was 46.7 Å/Pa·m$^3$.

Table 6 shows specific conditions, and Table 7 shows common conditions having nothing to do with targets. The feed gas was a mixed gas of argon and nitrogen, and Table 6 shows the volume percentage of nitrogen.

Table 6 shows film-forming rates and the specific resistances of the formed films. After the sputtering, all the films had a low specific resistance of not more than 100 μΩcm, and all the films had a golden color, which is a color tone obtained when N/Ti is 1.

TABLE 6

| Sample No. | N/Ti ratio of target | Nitrogen in feed gas (%) | Flow rate of feed gas (Pa · m$^3$/s) | Film-forming rate (Å/min) | Specific resistance of film right below target (μΩ · cm) | Remarks |
| --- | --- | --- | --- | --- | --- | --- |
| 14 | 0 | 50 | 0.065 | 85.3 | 98.1 | Conventional Example |
| 15 | 0.11 | 50 | 0.059 | 88.7 | 95.1 | Comparative Example |
| 16 | 0.20 | 50 | 0.054 | 90.4 | 94.2 | The |
| 17 | 0.31 | 30 | 0.081 | 91.3 | 86.2 | invention |
| 18 | 0.40 | 30 | 0.064 | 90.4 | 93.4 | |
| 19 | 0.51 | 30 | 0.052 | 89.9 | 94.3 | |
| 20 | 0.62 | 30 | 0.124 | 87.0 | 88.9 | |
| 21 | 0.72 | 10 | 0.098 | 88.8 | 87.2 | |
| 22 | 0.81 | 10 | 0.061 | 88.1 | 83.9 | |
| 23 | 0.90 | 10 | 0.033 | 86.8 | 85.1 | |
| 24 | 0.95 | 10 | 0.016 | 91.1 | 92.2 | |
| 25 | 0.97 | 10 | 0.008 | 90.1 | 95.1 | Comparative |
| 26 | 1.00 | 0 | 0.500 | 91.9 | 91.1 | Example |

2-2. Reactive sputtering properties

TABLE 7

| Item | Film-forming conditions |
| --- | --- |
| Substrate temperature | 250° C. |
| Base pressure | <3.0 × 10⁻⁴ Pa |
| Working gas pressure | 0.6 Pa |
| Presputtering time | 5 minutes |

Figure 9:
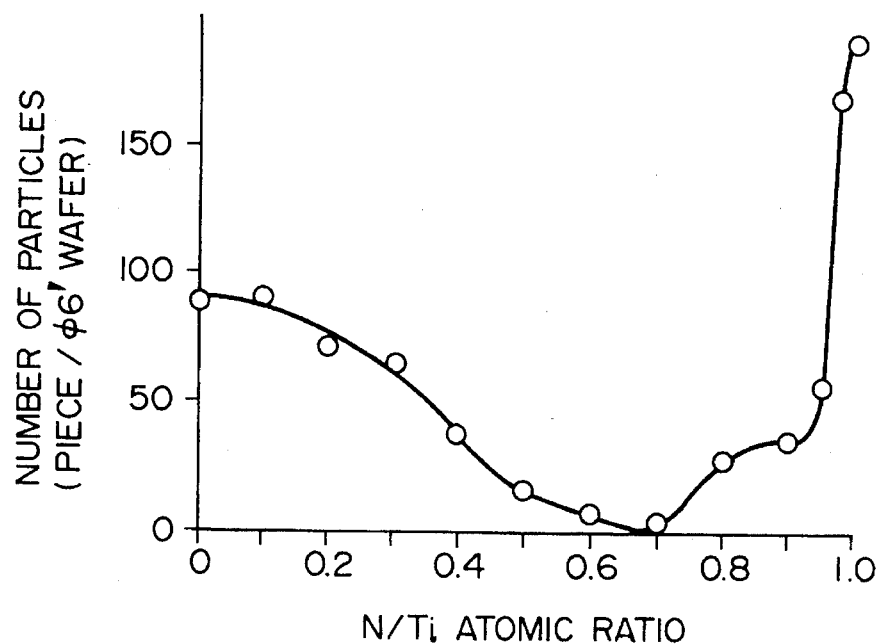
FIG. 9 shows the relationship between a target composition and the number of particles having a size of 0.5 μm or greater formed when a film was formed.

FIG. 9 shows the relationship between the target composition and the number of particles having a size of at least 0.5 μm, observed in thin films having a thickness of 1 μm (10,000 Å) formed on wafers having a diameter of 6 inches under the above conditions.

FIG. 9 shows that the crystal phase having a nitrogen/titanium atomic ratio of 0.4 to 0.95 where the crystal phase is an NaCl type single phase is excellent for preventing the occurrence of particles. In the range where the nitrogen/titanium atomic ratio exceeds 0.95, the number of particles increases together with a decrease in the density shown in FIG. 1, and it is seen that a decrease in the target density causes an increase in the number of particles. Further, the number of particles increases when the nitrogen/titanium atomic ratio is 0.3 or less. It is considered that this increase is caused by an increase in the crystal grain size.

Samples Nos. 19 to 23 having a nitrogen/titanium atomic ratio of 0.5 to 0.90 had an NaCl type single phase, an average crystal grain size of 100 μm or less and a relative density of at least 95%, and in particular, the number of particles caused by these Samples was very small.

Targets having a diameter of 75 mm and a thickness of 6 mm, prepared from Samples Nos. 19 and 21 having an NaCl type single phase and Samples Nos. 14 and 16 having an α-Ti phase as a main phase, all shown in Table 5, were measured for their film-forming rates with regard to sputtering power, and the resultant thin films were measured for changes in specific resistance with regard to sputtering power. The sputtering conditions, the feed gas composition and the feed gas flow rate were set as shown in Table 6, and other conditions were set as shown in Table 7.

Figure 10:
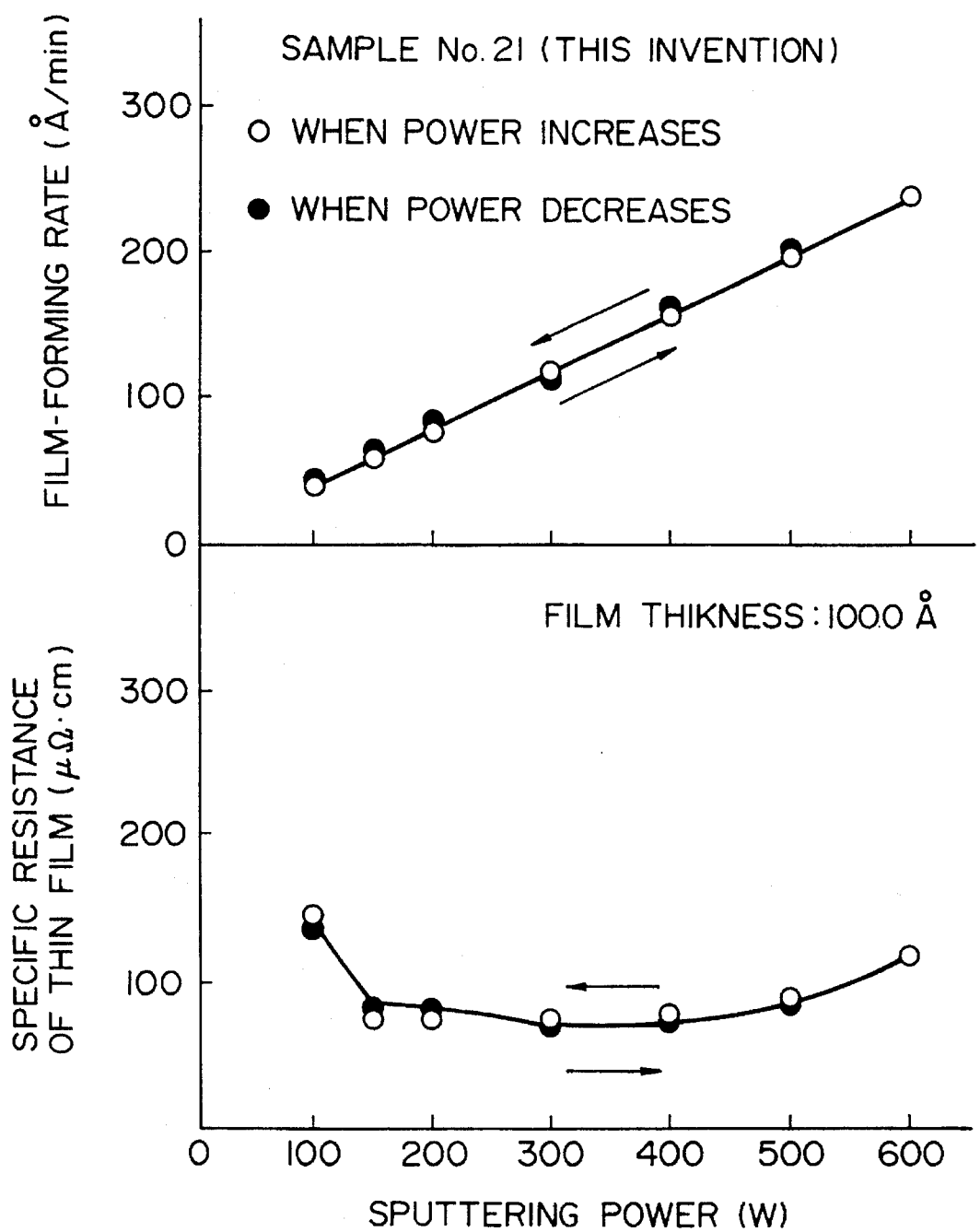
FIG. 10 shows film-forming rates and the hysteresis in specific resistance of an obtained film when a target of Sample No. 21 according to the present invention was used for forming the film by changing the sputtering power.
Figure 11:
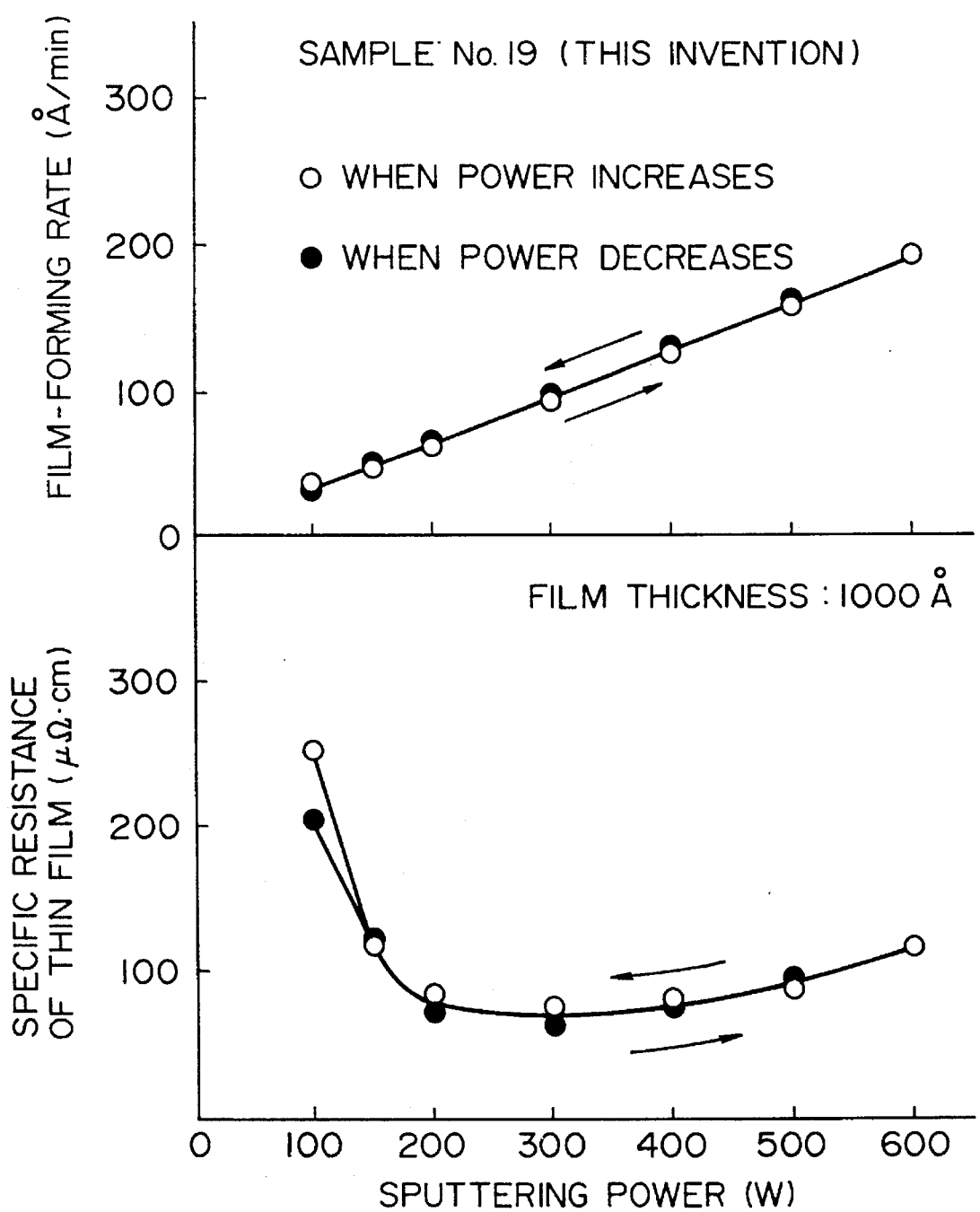
FIG. 11 shows film-forming rates and the hysteresis in specific resistance of an obtained film when a target of Sample No. 19 according to the present invention was used for forming the film by changing the sputtering power.

FIGS. 10 and 11 show relationships between the sputtering power and the film-forming rate and between the sputtering power and the specific resistance with regard to Samples Nos. 21 and 19 of an NaCl type. FIG. 12 shows the above relationships with regard to Sample No. 16 of an α-Ti phase as a main phase. FIG. 13 shows the above relationships with regard to Sample No. 14 which was a conventional target of pure titanium. In each of FIGS. 10 to 13, the arrow facing rightward shows a tendency when the power increases, and the arrow facing leftward shows a tendency when the power decreases. In the reactive sputtering using Sample No. 14 of pure titanium as a target, a hysteresis phenomenon occurred around a power of 200 to 400 W, in which the film-forming rate when the power increased and that when the power decreased differed by two to three times.

Further, concerning the relationship between the sputtering power and the specific resistance of a film, Sample No. 14 as Conventional Example caused a hysteresis phenomenon, in which the specific resistance value when the power increased and that when the power decreased differed around a power of 200 to 400 W.

On the other hand, when Samples Nos. 21 and 19 of an NaCl single phase were used, no hysteresis phenomenon occurred. It is further seen that the targets according to the present invention also gave films having a specific resistance of not more than 100 μΩcm in a wider range.

Further, Sample No. 16 having an α-Ti phase as a main phase was poor in preventing hysteresis as compared with Sample having an NaCl single phase, whereas it caused less hysteresis than Sample No. 14 of pure titanium.

The above results show that the use of an NaCl type target simultaneously overcomes the problems of (1) hysteresis and (2) a narrow low resistance region at the same time, which are problems in controlling conditions for the existing reactive sputtering using a target of pure titanium.

The target of the present invention has characteristic features useful for forming a barrier metal for a semiconductor that little hysteresis is involved with regard to composition-controlling factors such as a sputtering power, etc., for forming a titanium nitride film, that the variation in the film composition depending upon reactive sputtering conditions is decreased, that a film having a nitrogen/titanium atomic ratio of nearly 1 and a low resistance can be obtained, that the thin film composition does not depend on the position of the target, and that a thin film having a remarkably uniform composition can be obtained.

Out of targets according to the present invention, a target having an NaCl type crystal structure is particularly desirable for controlling the film forming in reactive sputtering, since the hysteresis which is a problem in forming a film can be almost completely removed. Although causing a little hysteresis, a target having a $Ti_2N$ type phase as a main phase has high tenacity, hardly undergoes chipping when produced, and can be excellently used for mass-production.

What is claimed is:

1. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film, wherein said target has a nitrogen/titanium atomic ratio, N/Ti, of 0.20 to 0.90.

2. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film, wherein said target has a nitrogen titanium atomic ratio, N/Ti, of 0.20 to 0.90 and a NaCl crystal structure.

3. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film, wherein the target has a nitrogen/titanium atomic ratio, N/Ti, of 0.50 to 0.90.

4. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film, wherein the target has a Ti$_2$N phase as a main phase.

5. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film wherein the target has a Ti$_2$N phase as a main phase and contains at least one of phase having a NaCl crystal structure and an αTi phase.

6. A method for forming a substantially stoichiometric titanium nitride film having a specific resistance of not more than 100 μΩcm, which method comprises the step of sputtering a target comprising titanium and nitrogen in the presence of a sputtering gas containing nitrogen to form the substantially stoichiometric titanium nitride film, wherein said target has a nitrogen/titanium ratio, N/Ti, of 0.35 to 0.55 and a Ti$_2$N phase as a main phase.

* * * * *